United States Patent
Yuan et al.

(10) Patent No.: US 10,515,590 B2
(45) Date of Patent: Dec. 24, 2019

(54) PIXEL COMPENSATION CIRCUIT, DRIVING METHOD, DISPLAY PANEL AND DISPLAY DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Zhidong Yuan, Beijing (CN); Yongqian Li, Beijing (CN); Can Yuan, Beijing (CN); Meng Li, Beijing (CN); Xuehuan Feng, Beijing (CN); Zhenfei Cai, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 18 days.

(21) Appl. No.: 15/991,172

(22) Filed: May 29, 2018

(65) Prior Publication Data

US 2019/0096326 A1    Mar. 28, 2019

(30) Foreign Application Priority Data

Sep. 22, 2017    (CN) .......................... 2017 1 0864062

(51) Int. Cl.
*G09G 3/3241* (2016.01)
*H01L 27/32* (2006.01)
(Continued)

(52) U.S. Cl.
CPC ......... *G09G 3/3241* (2013.01); *G09G 3/3233* (2013.01); *G09G 3/3258* (2013.01);
(Continued)

(58) Field of Classification Search
CPC .. G09G 3/3241; G09G 3/3233; G09G 3/3258; G09G 2300/0852;
(Continued)

(56) References Cited

U.S. PATENT DOCUMENTS 8,830,219 B2 *  9/2014  Choi .................... G09G 3/3233
                                                    345/211
8,917,225 B2 * 12/2014  Kang ................... G09G 3/3233
                                                    315/169.3
(Continued)

FOREIGN PATENT DOCUMENTS

CN      102243839 A     11/2011
CN      104751781 A      7/2015
CN      104898887 A      9/2015

OTHER PUBLICATIONS

First Office Action for Chinese Patent Application No. 20170864062.0 dated Jan. 4, 2019.

*Primary Examiner* — Peter D McLoone
(74) *Attorney, Agent, or Firm* — Calfee, Halter & Griswold LLP

(57) ABSTRACT

The present disclosure relates to a pixel compensation circuit, a driving method for the pixel compensation circuit, a display panel and a display device. The pixel compensation circuit includes a reset circuit, a data writer, a compensation circuit, a driver, and a light emitting device. The threshold voltage of the light emitting device may be provided to the driver through the compensation circuit.

17 Claims, 4 Drawing Sheets

(51) Int. Cl.
*G09G 3/3258* (2016.01)
*G09G 3/3233* (2016.01)

(52) U.S. Cl.
CPC . H01L 27/3265 (2013.01); *G09G 2300/0852* (2013.01); *G09G 2300/0861* (2013.01); *G09G 2310/0251* (2013.01); *G09G 2320/0204* (2013.01); *G09G 2320/0295* (2013.01); *G09G 2320/043* (2013.01)

(58) Field of Classification Search
CPC ... G09G 2300/0861; G09G 2310/0251; G09G 2320/0204; G09G 2320/0295; G09G 2320/043; H01L 27/3265
See application file for complete search history.

(56) References Cited

U.S. PATENT DOCUMENTS

| | | | |
|---|---|---|---|
| 9,514,677 B2 * | 12/2016 | Chung | ................ G09G 3/003 |
| 2011/0090200 A1 | 4/2011 | Choi et al. | |
| 2011/0164018 A1 | 7/2011 | Kang et al. | |
| 2014/0354522 A1 | 12/2014 | Chung et al. | |

* cited by examiner

PIXEL COMPENSATION CIRCUIT, DRIVING METHOD, DISPLAY PANEL AND DISPLAY DEVICE

CROSS-REFERENCE TO RELATED APPLICATIONS

This application claims priority to Chinese Patent Application 201710864062.0, filed Sep. 22, 2017, the entire contents of which are incorporated herein by reference.

TECHNICAL FIELD

The present disclosure relates to the display technical field, and in particular, to a pixel compensation circuit, a driving method for the pixel compensation method, a display panel and a display device.

BACKGROUND

Organic Light Emitting diode (OLED) display is one of the hot spots in the current research field. As compared with Liquid Crystal Displays (LCDs), the OLED display has advantages such as a low energy consumption, a low production cost, self-luminescence, a wide range and a fast response speed. At present, OLED display panels have begun to replace traditional LCD display panels in display fields such as mobile phones and digital cameras, and are expected to become mainstream choices for next-generation display panels.

The uniformity of light emission of the OLED display panels mainly depends on the driving transistor portion and the light emitting device portion. In prior arts, a pixel compensation circuit that can compensate the threshold voltage of the driving transistor is generally used to eliminate the influence of the threshold voltage of the driving transistor and its drift on the uniformity of light emission. However, there is no pixel compensation related arts that can eliminate the influence of aging of the light emitting device on the uniformity of light emission.

SUMMARY

Embodiments of the present disclosure provide a pixel compensation circuit, a driving method for the pixel compensation method, a display panel and a display device, so as to eliminate the non-uniformity of light emission of display panels due to aging of the light emitting device.

An embodiment of the present disclosure provides a pixel compensation circuit, including a reset circuit, a data writer, a compensation circuit, and a driver;
wherein:
a first control terminal of the reset circuit is connected to a first control signal terminal, a second control terminal of the reset circuit is connected to a second control signal terminal, a first input terminal and a second input terminal of the reset circuit are connected to a sensing line, a first output terminal of the reset circuit is connected to a first node, a second output terminal of the reset circuit is connected to a second node, and the reset circuit is configured to provide a reset signal output by the sensing line to the first node and the second node under control of the first control signal terminal and the second control signal terminal;
a control terminal of the data writer is connected to a third control signal terminal, an input terminal of the data writer is connected to a data line, an output terminal of the data writer is connected to a third node, and the data writer is configured to provide a data signal output by the data line to the third node under control of the third control signal terminal;
a first terminal of the compensation circuit is connected to the first node, a second terminal of the compensation circuit is connected to the second node, a third terminal of the compensation circuit is connected to the third node, and the compensation circuit is configured to provide a threshold voltage of the light emitting device to the third node; and
a control terminal of the driver is connected to the third node, an input terminal of the driver is connected to a first power supply terminal, an output terminal of the driver is connected to the second node, and the driver is configured to drive the light emitting device to emit light under control of the third node.

According to an exemplary embodiment, a terminal of the light emitting device is connected to the second node, and another terminal of the light emitting device is connected to a power supply terminal which outputs a voltage lower than the voltage of a voltage output from the first power supply terminal.

According to an exemplary embodiment, the reset circuit includes a first switching transistor and a second switching transistor;
a gate of the first switching transistor is connected to the first control signal terminal, a drain of the first switching transistor is connected to the sensing line, and a source of the first switching transistor is connected to the first node; and
a gate of the second switching transistor is connected to the second control signal terminal, a drain of the second switching transistor is connected to the sensing line, and a source of the second switching transistor is connected to the second node.

According to an exemplary embodiment, the data writing circuit includes a third switching transistor; and
a gate of the third switching transistor is connected to the third control signal terminal, a drain of the third switching transistor is connected to the data line, and a source of the third switching transistor is connected to the third node.

According to an exemplary embodiment, the compensation circuit includes a first capacitor and a second capacitor;
a terminal of the first capacitor is connected to the first node, and another terminal of the first capacitor is connected to the third node; and
a terminal of the second capacitor is connected to the first node, and another terminal of the second capacitor is connected to the second node.

According to an exemplary embodiment, the driver includes a driving transistor; and
a gate of the driving transistor is connected to the third node, the drain of the driving transistor is connected to the first power supply terminal, and the source of the driving transistor is connected to the second node.

According to an exemplary embodiment, the first switching transistor, the second switching transistor and the third switching transistor and the driving transistor are all N-type transistors.

An embodiment of the present disclosure provides a display panel, including the pixel compensation circuit as described above.

An embodiment of the present disclosure provides a display device, including the display panel as described above.

An embodiment of the present disclosure provides a driving for the pixel compensation circuit as described above. The method includes:

in a first data writing stage, resetting by the reset circuit a potential at the second terminal of the compensation circuit under control of the second control terminal, and writing by the data writer a first data signal output by the data line to the compensation circuit under control of the third control signal terminal;

in a compensation stage, providing by the compensation circuit the first data signal and the threshold voltage of the light emitting device to the control terminal of the driver;

in a reset stage, resetting by the reset circuit a potential at the first terminal of the compensation circuit under control of the first control signal terminal, and resetting by the reset circuit a potential at the output terminal of the driver under control of the second control signal terminal; and in a light emitting stage, driving by the driver the light emitting device to emit light under joint control of the threshold voltage of the light emitting device and the first data signal.

According to an exemplary embodiment, in the driving method, before the reset stage in which the reset circuit resets the potential at the first terminal of the compensation circuit under control of the first control signal terminal, and resets the potential at the output terminal of the driver under control of the second control signal terminal, and after the light emitting stage in which the drivers drives the light emitting device to emit light under joint control of the threshold voltage of the light emitting device and the first data signal, the method further includes:

in a second data writing stage, providing by the data writer a second data signal output by the data line to the control terminal of the driver under control of the third control signal terminal, wherein a voltage of the second data signal is equal to a sum of a voltage of the first data signal and the threshold voltage of a driving transistor in the driver.

DETAILED DESCRIPTION

Hereinafter, specific implementations of a pixel compensation circuit, a driving method thereof, a display panel, and a display device provided by the embodiments of the present disclosure will be described in detail with reference to the accompanying drawings. It should be noted that the embodiments described in this description are merely some but not all of the embodiments of the present disclosure. All other embodiments obtained by a person of ordinary skill in the art based on the embodiments of the present disclosure shall fall within the protection scope of the present disclosure.

Figure 1A:
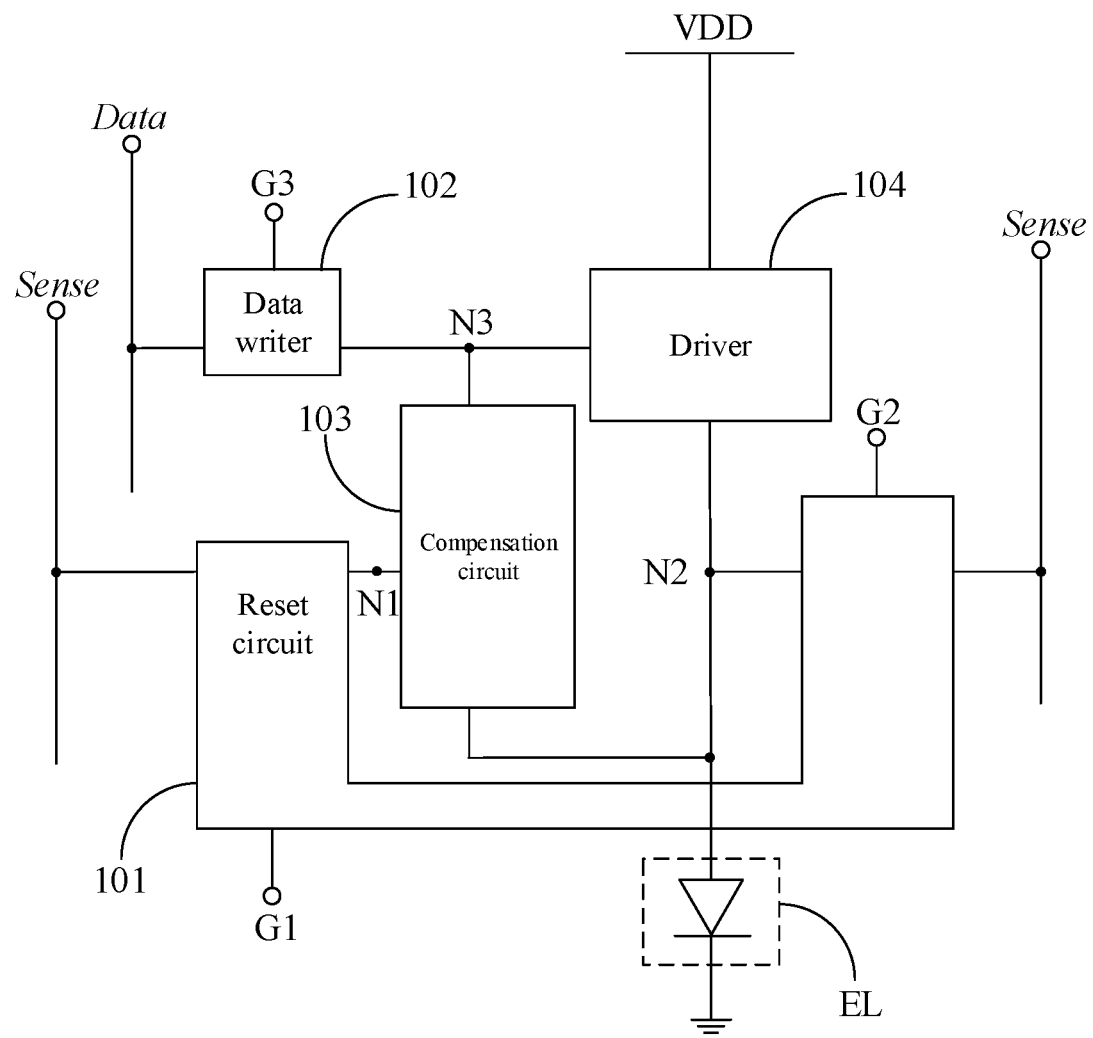
FIGS. 1a and 1b are schematic diagrams showing structures of pixel compensation circuits according to embodiments of the present disclosure.
Figure 1B:
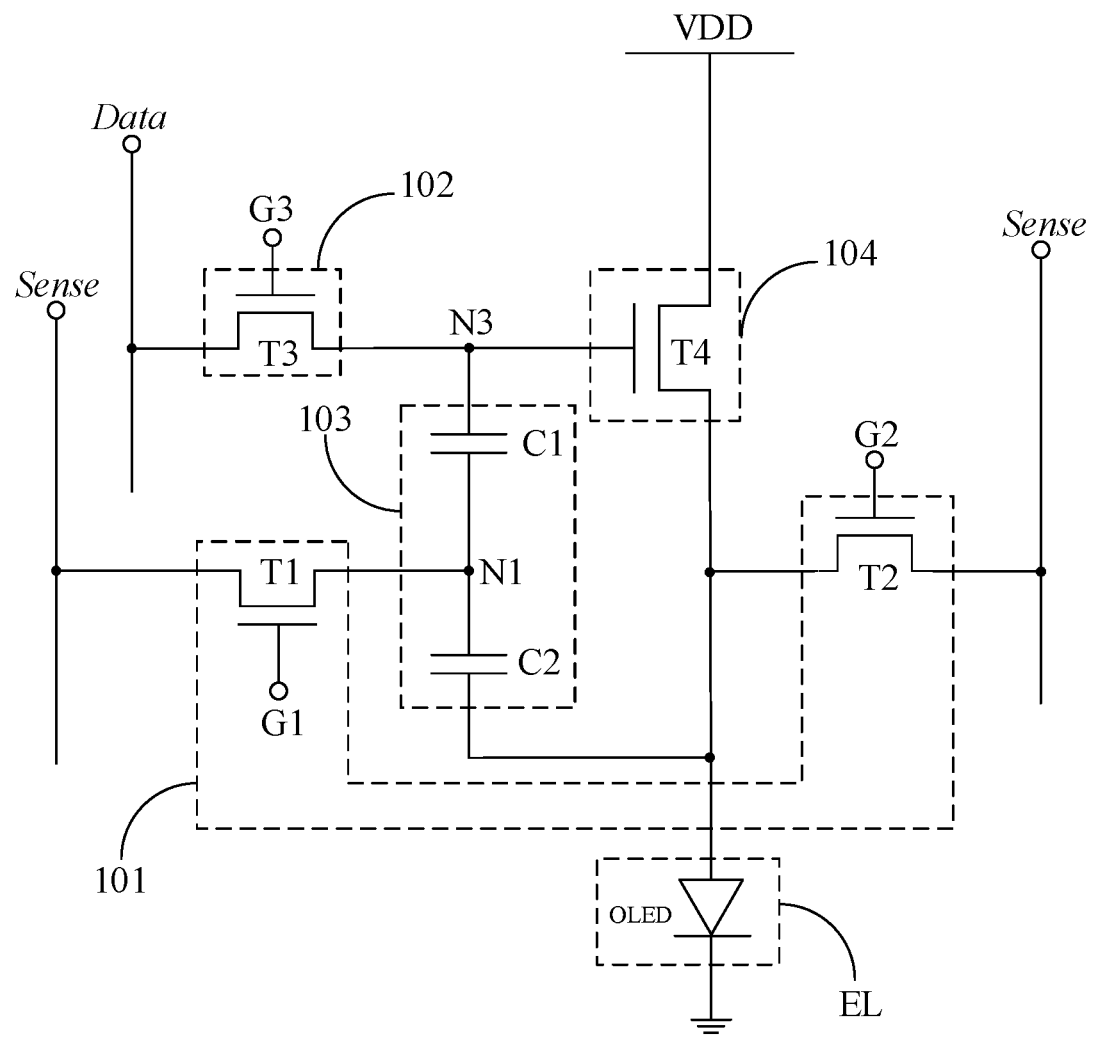

An embodiment of the present disclosure provides a pixel compensation circuit. As shown in FIGS. 1a and 1b, the pixel compensation circuit includes a reset circuit 101, a data writer 102, a compensation circuit 103, and a driver 104.

A first control terminal of the reset circuit 101 is connected to a first control signal terminal G1, a second control terminal of the reset circuit 101 is connected to a second control signal terminal G2, a first input terminal and a second input terminal of the reset circuit 101 are connected to a sensing line Sense, a first output terminal of the reset circuit 101 is connected to a first node N1, a second output terminal of the reset circuit 101 is connected to a second node N2, and the reset circuit 101 is configured to provide a reset signal $V_{ref}$ output by the sensing line Sense to the first node N1 and the second node N2 under control of the first control signal terminal G1 and the second control signal terminal G2.

A control terminal of the data writer 102 is connected to a third control signal terminal G3, an input terminal of the data writer 102 is connected to a data line Data, an output terminal of the data writer 102 is connected to a third node N3, and the data writer 102 is configured to provide a data signal $V_{data}$ output by the data line Data to the third node N3 under control of the third control signal terminal G3.

A first terminal of the compensation circuit 103 is connected to the first node N1, a second terminal of the compensation circuit 103 is connected to the second node N2, a third terminal of the compensation circuit 103 is connected to the third node N3, and the compensation circuit 103 is configured to provide a threshold voltage $V_{oled\text{-}th}$ of the light emitting device EL to the third node N3.

A control terminal of the driver 104 is connected to the third node N3, an input terminal of the driver 104 is connected to a first power supply terminal VDD, an output terminal of the driver 104 is connected to the second node N2, and the driver 104 is configured to drive the light emitting device to emit light under control of the third node N3.

A terminal of the light emitting device EL is connected to the second node N2, another terminal of the light emitting device EL is connected to a power supply terminal which outputs a voltage lower than the voltage of a voltage output from the first power supply terminal, for example, connected to the ground or connected to a low power supply terminal (for example, the second power supply terminal VSS as described later).

In the pixel compensation circuit provided in the embodiment of the present disclosure, the threshold voltage $V_{oled\text{-}th}$ of the light emitting device EL may be provided to the driver 104 through the compensation circuit 103, and if the aging of the light emitting device EL occurs, the threshold voltage $V_{oled\text{-}th}$ of the light emitting device EL is increased, so that the driver 104 can provide a larger current to the light emitting device EL when the light emitting device EL is driven to emit light, thereby enhancing the brightness of the light emitting device EL in the aging area, and improving non-uniformity of light emission of a display panel.

It should be noted that, in specific implementation, in the pixel compensation circuit provided in the embodiment of the present disclosure, the light emitting device EL may be an OLED; or the light emitting device EL may be a quantum dot light emitting diode. In practical applications, the specific structure of the light emitting device EL needs to be designed and determined according to the actual application environment, and is not limited herein. In the following descriptions, for example, the light emitting device EL is an OLED.

In specific implementation, in the pixel compensation circuit provided in the embodiment of the present disclosure, one terminal of the light emitting device EL may be connected to the second node N2, and the other terminal of the light emitting device EL may be grounded. Alternatively, one terminal of the light emitting device EL may be connected to the second node N2 and the other terminal of the light emitting device EL may be connected to the second power supply terminal VSS. The voltage of the signal of the first power supply terminal VDD is generally a high voltage, and the voltage of the signal of the second power supply terminal VSS is generally a low voltage or the ground. In practical applications, the voltages of the signals of the first power supply terminal VDD and the second power supply terminal VSS need to be designed and determined according to the actual application environment, and are not limited herein.

The present disclosure will be described in detail below in conjunction with specific embodiments. It should be noted that embodiments below are provided for providing better understanding of the present disclosure, but are not intended to limit the present disclosure.

In specific implementation, in the pixel compensation circuit provided in the embodiment of the present disclosure, as shown in FIG. 1b, the reset circuit 101 includes a first switching transistor T1 and a second switching transistor T2.

A gate of the first switching transistor T1 is connected to the first control signal terminal G1, a drain of the first switching transistor T1 is connected to the sensing line Sense, and a source of the first switching transistor T1 is connected to the first node N1.

A gate of the second switching transistor T2 is connected to the second control signal terminal G2, a drain of the second switching transistor T2 is connected to the sensing line Sense, and a source of the second switching transistor T2 is connected to the second node N2.

Specifically, in the pixel compensation circuit provided in the embodiment of the present disclosure, when the first switching transistor T1 is in a conducted state under control of the first control signal terminal G1, the reference signal $V_{ref}$ output by the sensing line Sense is written into the first node N1 through the conducted first switching transistor T1 to reset the first node N1, thereby realizing resetting of the first terminal of the compensation circuit 103 connected to the first node N1. When the second switching transistor T2 is in a conducted state under control of the second control signal terminal G2, the reference signal $V_{ref}$ output by the sensing line Sense is written into the second node N2 through the conducted second switching transistor T2 to reset the second node N2, thereby realize resetting of the second terminal of the compensation circuit 103 which is connected to the second node N2 and the output terminal of the driver 104.

The above is only an example to illustrate the specific structure of the reset circuit 101 in the pixel compensation circuit. In the specific implementation, the specific structure of the reset circuit 101 is not limited to the above structure provided by the embodiment of the disclosure, and may also be other structures known to those skilled in the art. The present disclosure does not impose specific limitations on this.

In specific implementation, in the pixel compensation circuit provided in the embodiment of the present disclosure, as shown in FIG. 1b, the data writer 102 includes a third switching transistor T3.

A gate of the third switching transistor T3 is connected to the third control signal terminal G3, a drain of the third switching transistor T3 is connected to the data line Data, and a source of the third switching transistor T3 is connected to the third node N3.

Specifically, in the pixel compensation circuit provided in the embodiment of the present disclosure, when the third switching transistor T3 is in the conducted state under control of the third control signal terminal G3, the data signal $V_{data}$ is transmitted through the conducted third switching transistor T3 to the third node N3, so as to control the control terminal of the driver 104.

The above is only an example to illustrate the specific structure of the data writer 102 in the pixel compensation circuit. In the specific implementation, the specific structure of the data writer 102 is not limited to the above structure provided by the embodiments of the present disclosure, and can also be other structures known by those skilled in the art. The present disclosure does not impose specific limitations on this.

In specific implementation, in the pixel compensation circuit provided in the embodiment of the present disclosure, as shown in FIG. 1b, the compensation circuit 103 includes a first capacitor C1 and a second capacitor C2.

A terminal of the first capacitor C1 is connected to the first node N1, and another terminal of the first capacitor C1 is connected to the third node N3.

A terminal of the second capacitor C2 is connected to the first node N1, and another terminal of the second capacitor C2 is connected to the second node N2.

Specifically, in the pixel compensation circuit provided in the embodiment of the present disclosure, when the third switching transistor T3 is in a non-conducted (turned-off) state under control of the third control signal terminal G3, the compensation circuit 103 writes the threshold voltage $V_{oled-th}$ of the light emitting device EL to the third node N3 so as to control the control terminal of the driver 104, thereby performing aging compensation on the light emitting device EL.

The above is merely an example to illustrate the specific structure of the compensation circuit 103 in the pixel compensation circuit. In the specific implementation, the specific structure of the compensation circuit 103 is not limited to the above structure provided by the embodiment of the present disclosure, and may also be other structures known to those skilled in the art. The present disclosure does not impose specific limitations on this.

In specific implementation, in the pixel compensation circuit provided in the embodiment of the present disclosure, as shown in FIG. 1b, the driver 104 includes a driving transistor T4.

A gate of the driving transistor T4 is connected to the third node N3, a drain of the driving transistor T4 is connected to the first power supply terminal VDD, and a source of the driving transistor T4 is connected to the second node N2.

Specifically, the above-mentioned pixel compensation circuit provided in the embodiment of the present disclosure, when the driving transistor T4 is in a conducted state under joint control of the data signal $V_{data}$ and the threshold voltage $V_{oled-th}$ of the light emitting device EL, the signal at the first power supply terminal VDD is converted into a current by the conducted driving transistor T4 so as to drive the light emitting device EL to emit light.

The above is merely an example to illustrate the specific structure of the driver 104 in the pixel compensation circuit. In the specific implementation, the specific structure of the driver 104 is not limited to the above structure provided by the embodiments of the present disclosure, and may also be other structures known by those skilled in the art. The present disclosure does not impose specific limitations on this.

In specific implementation, in the pixel compensation circuit provided in the embodiment of the present disclosure, when the light emitting device EL is and OLED, light is emitted under the action of the current when the driving transistor T4 is in a saturated state. The anode of the OLED is connected to the second node N2, and the cathode of the OLED is grounded.

In the prior art, to improve the non-uniformity of light emission of the display panel caused by the aging of the light emitting device EL, the number of switching transistors included in the circuit is relative high and the working time sequence of the circuit is relatively complicated, resulting in difficulties in processes and increases in the production costs and large area occupied by the pixel compensation circuit. In the pixel compensation circuit shown in FIG. 1b provided by the disclosed embodiment, the first switching transistor T1, the second switching transistor T2, and the third switching transistor T3 cooperate with each other with a simple timing and less signal lines to write the threshold voltage $V_{oled\text{-}th}$ of the light emitting device EL into the driving transistor T4, so as to compensate the aging of the light emitting device EL, thereby simplifying the preparation processes, reducing the production costs, and reducing the occupied area, which is advantageous to the design of the high resolution display panel.

It should be noted that depending on types and input signals, the sources and the drains of the first switching transistor T1, the second switching transistor T2, the third switching transistor T3 and the driving transistor T4 mentioned in the above embodiments of the present disclosure are interchangeable, and no specific distinction is made here.

Generally, when the first switching transistor T1, the second switching transistor T2, the third switching transistor T3 and the driving transistor T4 are all P-type transistors, the source of each transistor is an input terminal and the drain of each transistor is an output terminal; when the first switching transistor T1, the second switching transistor T2, the third switching transistor T3 and the driving transistor T4 are all N-type transistors, the drain of each transistor is an input terminal and the source of each transistor is an output terminal In addition, in the pixel compensation circuit provided in the embodiment of the present disclosure, the first switching transistor T1, the second switching transistor T2, the third switching transistor T3 and the driving transistor T4 are all P-type transistors or all N-type transistors. The present disclosure does not impose specific limitations on this.

According to an exemplary embodiment, in the pixel compensation circuit provided by the embodiment of the present disclosure, the first switching transistor T1, the second switching transistor T2, the third switching transistor T3 and the driving transistor T4 are all N-type transistors, which can simplify the manufacturing processes of the pixel compensation circuit.

Based on the same inventive concept, an embodiment of the present disclosure further provides a driving method for the pixel compensation circuit described above. Since the principle of the driving method to solve the problem is similar to the pixel compensation circuit described above, the implementation of the driving method can be found in the descriptions regarding the implementation of the pixel compensation circuit in the foregoing example, and repeated description is omitted here.

Figure 2:
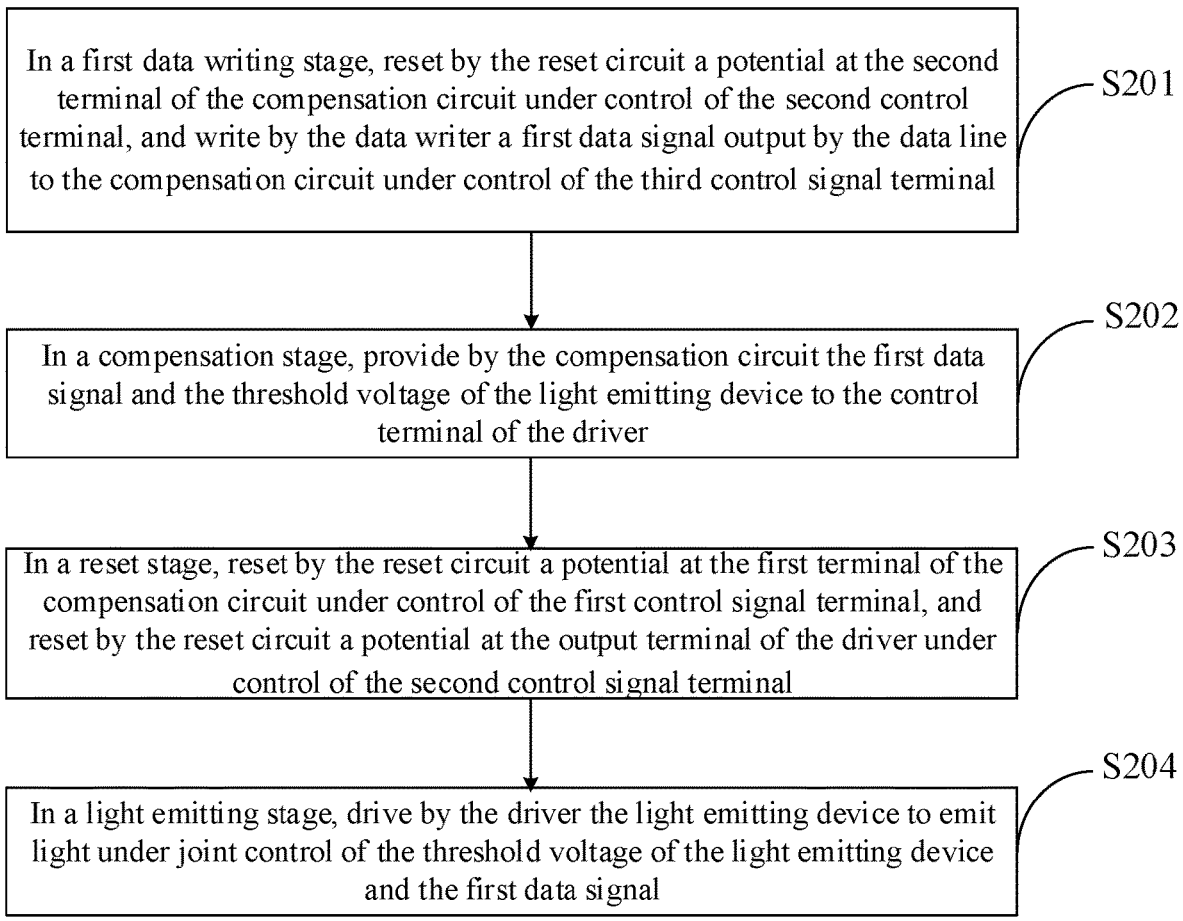
FIG. 2 is a flow chart showing a driving method for pixel compensation according to embodiments of the present disclosure.

Specifically, as shown in FIG. 2, a driving method for the pixel compensation circuit provided by the embodiment of the present disclosure may include the following steps:

In S201, in a first data writing stage, the reset circuit resets a potential at the second terminal of the compensation circuit under control of the second control terminal, and the data writer writes a first data signal output by the data line to the compensation circuit under control of the third control signal terminal.

In S202, in a compensation stage, the compensation circuit provides the first data signal and the threshold voltage of the light emitting device to the control terminal of the driver.

In S203, in a reset stage, the reset circuit resets a potential at the first terminal of the compensation circuit under control of the first control signal terminal, and the reset circuit resets a potential at the output terminal of the driver under control of the second control signal terminal.

In S204, in a light emitting stage, the driver drives the light emitting device to emit light under joint control of the threshold voltage of the light emitting device and the first data signal.

In specific implementation, in order to alleviate the influence of the threshold voltage $V_{T4\text{-}th}$ of the driving transistor T4 on the uniformity of light emission of the display panel, in the above-mentioned driving method provided in the embodiment of the present disclosure, before the reset stage in step S203 in which the reset circuit resets the potential at the first terminal of the compensation circuit under control of the first control signal terminal, and resets the potential at the output terminal of the driver under control of the second control signal terminal, and after the light emitting stage in step S204 in which the drivers drives the light emitting device to emit light under joint control of the threshold voltage of the light emitting device and the first data signal, the method further includes:

in a second data writing stage, providing by the data writer a second data signal output by the data line to the control terminal of the driver under control of the third control signal terminal, wherein a voltage of the second data signal is equal to a sum of a voltage of the first data signal and the threshold voltage of a driving transistor in the driver.

Figure 3:
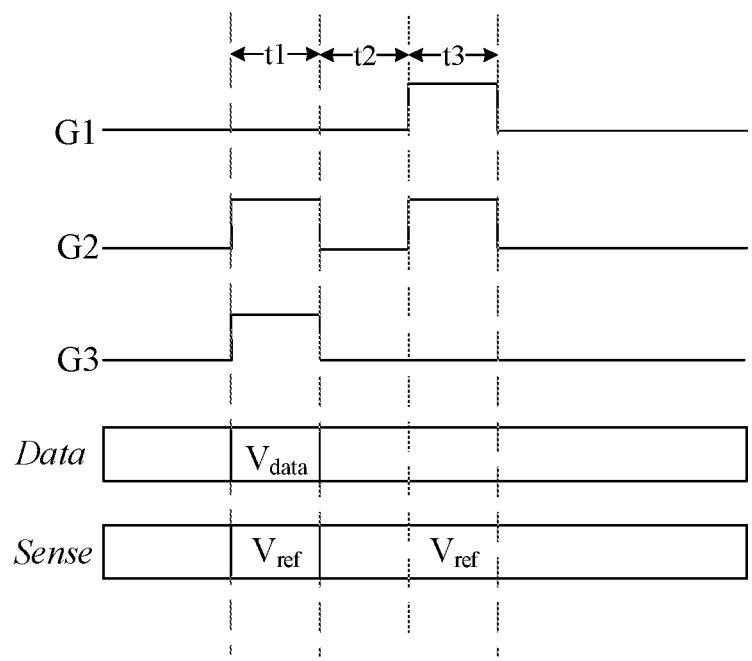
FIG. 3 is a schematic diagram showing a driving sequence of the pixel compensation circuit as shown in FIG. 1b.

In order to better understand the technical solutions of the present disclosure, the working process of the pixel compensation circuit shown in FIG. 1b is described as follows. In the pixel compensation circuit shown in FIG. 1b, the driving transistor and all the switching transistors are all N-type transistors, each of which is turned on under a high level and turned off under a low level; the light emitting device EL is an OLED, an anode of the OLED is connected to the second node N2, and the cathode of the OLED is connected to the second power supply terminal VSS (not shown in FIG. 1b), and the second power supply terminal VSS is grounded. The corresponding input timing diagram is as shown in FIG. 3. Specifically, the following descriptions are made based on the first data writing stage t1, the compensation stage t2, and the reset stage t3 as shown in the timing diagram of FIG. 3.

In the first data writing stage t1, the first control signal G1 outputs a low level, the second control signal G2 outputs a high level, and the third control signal G3 outputs a high level.

The first switching transistor T1 is in the non-conducted (off) state, and the second switching transistor T2, the third switching transistor T3 and the driving transistor T4 are in the conducted (on) state. The data signal Vdata of the data line Data is output to the third node N3 via the conducted third switching transistor T3, and is stored to the first capacitor C1 and the second capacitor C2 via the third node N3, and at the same time the driving transistor T4 is controlled to be conducted. The reference signal $\backslash T_{ref}$ output from the sensing line Sense is output to the second node N2 through the conducted second switching transistor T2, and is stored to the first capacitor C1 and the second capacitor C2 via the second node N2. At this time, the light emitting device EL does not emit light, and the voltage difference across the first capacitor C1 and the second capacitor C2 is the voltage difference $V_{GS}$ between the gate and the source of the driving transistor T4, and $V_{GS}$ is as follows:

$$V_{GS}=V_{data}-V_{ref} \qquad (1)$$

In the compensation stage t2, the first control signal terminal G1 outputs a low level, the second control signal terminal G2 outputs a low level, and the third control signal terminal G3 outputs a low level.

The first switching transistor T1, the second switching transistor T2, and the third switching transistor T3 are in the non-conducted state, and the driving transistor T4 is in the conducted state. The signal at the first power signal terminal VDD charges the second node N2 through the conducted driving transistor T4. Finally, the potential at the second node N2 is the sum of the signal $V_{ss}$ at the second power signal terminal VSS and the threshold voltage $V_{oled-th}$ of the light emitting device EL, i.e., $V_{ss}+V_{oled-th}$. Since the total charge of the first capacitor C1 and the second capacitor C2 remains unchanged, the $V_{GS}$ remains unchanged, the potential at the second node N2 and the potential at the third node N3 are simultaneously raised, and finally the potential at the third node N3 is the gate potential of the driving transistor T4:

$$V_G=V_{data}-V_{ref}+V_{ss}+V_{oled-th} \qquad (2)$$

At this time, the potential at the first node N1 is:

$$V_{N1}=C_1*(V_{ss}-V_{oled-th})/(C_1+C_2) \qquad (3)$$

In the reset stage t3, the first control signal terminal G1 outputs a high level, the second control signal terminal G2 outputs a high level, and the third control signal terminal G3 outputs a low level.

The first switching transistor T1, the second switching transistor T2, and the driving transistor T4 are in the conducted state, and the third switching transistor T3 is in the non-conducted state. The reference signal $V_{ref}$ output by the sensing line Sense is output to the second node N2 through the conducted second switching transistor T2, the potential at the second node N2 is pulled down to $V_{ref}$, and the reference signal $V_{ref}$ output by the sensing line Sense is output to the first node N1 through the conducted first switching transistor T1 so that the first node N1 is reset to $V_{ref}$. Compared to the stage t2, change in the potential at the first node N1 is as follows:

$$\Delta V_{N1}=V_{ref}-C_1*(V_{ss}+V_{oled-th})/(C_1+C_2) \qquad (4)$$

Since both the first switching transistor T1 and the second switching transistor T2 are in the conducted state, the second capacitor C2 is discharged, the charge of the first capacitor C1 is conserved, the potential at the first node N1 and the potential at the third node N3 are simultaneously reduced, and the potential at the third node N3 (that is, the gate potential of the driving transistor T4) is:

$$V_G=V_{data}+C_2*(V_{ss}+V_{oled-th})/(C_1+C_2) \qquad (5)$$

Then, the luminous input $V_{GS}$ is:

$$V_{GS}=V_{data}+C_2*(V_{ss}+V_{oled-th})/(C_1+C_2)-V_{ref} \qquad (6)$$

According to the above formula, $V_{GS}$ of the driving transistor T4 is caused by the data signal $V_{data}$ of the data line Data, the signal $V_{ss}$ of the second power supply terminal VSS, the reference signal $V_{ref}$ of the sensing line Sense, and the threshold voltage $V_{oled-th}$ of the light emitting device EL. In specific implementation, the second power supply terminal VSS is grounded, and the output signal Vss of the second power supply terminal is generally 0. Since the reference voltage $V_{ref}$ is an externally supplied electrical signal, the reference voltage $V_{ref}$ may be set to any value according to an actual need. For example, in the embodiment of the present disclosure, the reference signal $V_{ref}$ is set as 0, and in such case, $\alpha=C_2/(C_1+C_2)$, and the above formula can be simplified as follows:

$$V_G=V_{data}+\alpha*V_{oled-th} \qquad (7)$$

Therefore, when the light emitting device EL is driven to emit light by the driving transistor T4, the operating current $I_{EL}$ for driving the light emitting device EL to emit light by the driving transistor T4 is:

$$I_{EL}=K(V_{GS}-V_{T4-th})^2=K(V_{data}+\alpha*V_{oled-th}-V_{T4-th})^2 \qquad (8)$$

where $K=\mu C_{ox}*W/L$, $\mu$ is the mobility of the driving transistor T4, Cox is the capacitance of the gate oxide layer per unit area, and W/L is the width to length ratio of the driving transistor T4. Therefore, the operating current $I_{EL}$ that drives the light emitting device EL to emit light by the driving transistor T4 is related to the voltage $V_{data}$ of the data signal Data, the threshold voltage $V_{T4-th}$ of the driving transistor T4, and the threshold voltage $V_{oled-th}$ of the light emitting device EL. When the aging of the light emitting device EL occurs. the threshold voltage $V_{oled-th}$ increases, and the operating current $I_{EL}$ of the light emitting device EL is increased accordingly, thereby enhancing the brightness of the light emitting device EL in the aging region, and solving the problem of uneven light emission of the display panel.

In summary, through the internal compensation method, the operating current $I_{EL}$ of the light emitting device EL is increased, which further enhances the brightness of the light emitting device EL in the aging region, and alleviates the phenomenon of uneven light emission of the display panel caused by aging of the light emitting device EL.

Further, the threshold voltage $V_{T4-th}$ of the driving transistor T4 may be captured by an external compensation method based on the circuit shown in FIG. 1b provided in the embodiment of the present disclosure, and the value of the data signal $V_{data}$ provided by the data line Data in stage T1 may be Increased to $V_{data}+V_{T4-th}$, and then the operating current $I_{EL}$ of the light-emitting device EL is changed to:

$$I_{EL}=K(V_{GS}-V_{T4-th})^2=K(V_{data}+\alpha*V_{oled-th})^2 \qquad (9)$$

Thus, the operating current $I_{EL}$ when the light emitting device EL is driven to emit light is only related to the data signal $V_{data}$ of the data signal Data and the threshold voltage $V_{oled-th}$ of the light emitting device EL, irrespective of the threshold voltage $V_{T4-th}$ of the driving transistor T4. Therefore, it is possible to alleviate the influence of the threshold voltage $V_{T4-th}$ shift caused by the process of the driving transistor T4 and the long-time operation on the operating current of the driving light emitting device EL, so that the operating current of the light emitting device EL remains stable, thereby ensuring the normal operation of the light emitting device, and further increasing the uniformity of light emission of the display panel. Also, since the operating current $I_{EL}$ of the light emitting device EL is affected by the threshold voltage $V_{oled-th}$ of the light emitting device EL, when aging of the light emitting device EL occurs, the $V_{oled-th}$ of the light emitting device EL will increase, resulting in a corresponding increase in the current $I_{EL}$, and thus the aging of the light emitting device may be compensated.

It should be noted that, when the reference signal $V_{ref}$ output from the sensing line is not 0, the operating current $I_{EL}$ of the light emitting device EL is changed to:

$$I_{EL}=K(V_{GS}-V_{T4-th})^2=K(V_{data}+\alpha*V_{oled-th}-V_{ref})^2 \quad (10)$$

It can be known from the formula (10) that the operating current $I_{EL}$ of the driving light emitting device EL is related to the reference signal $V_{ref}$. Therefore, the operating current $I_{EL}$ of the light emitting device EL can also be controlled by the reference signal $V_{ref}$ output by the sensing line Sense to realize the aging compensation of the light emitting device EL.

In addition, in the pixel compensation circuit shown in FIG. 1b provided in the embodiment of the present disclosure, the sensing line Sense may sense the change of the operating current $I_{EL}$ provided by the driving transistor T4 to the light emitting device EL. Therefore, based on the change of the operating current $I_{EL}$ provided by the driving transistor T4 to the light emitting device EL which is sensed by the sensing line Sense, the aging compensation can be realized by way of external compensation to increase $V_{data}$, thereby improving the light emitting uniformity of the display panel.

Based on the same inventive concept, an embodiment of the present disclosure further provides a display panel including any one of the above pixel compensation circuits provided by the embodiments of the present disclosure. Since the principle of the display panel to solve the problem is similar to the aforementioned pixel compensation circuit, implementation of the pixel compensation circuit in the display panel can be found in the previous description regarding the implementation of the pixel compensation circuit in the foregoing example, and the repeated description is omitted.

Based on the same inventive concept, an embodiment of the present disclosure further provides a display device including the above display panel provided by the embodiments of the present disclosure. The display device may be a mobile phone, a tablet computer, a television set, a display panel, a notebook computer, a digital photo frame, a navigator, a smart watch, a fitness wristband, a personal digital assistant, and any other product or component that has a display function. Other essential components for the display device are understood by those of ordinary skill in the art, which are not described herein, and should not be construed as limiting the present disclosure. The implementation of the display device can be found in the previous description regarding the display panel and repeated description is omitted here.

Embodiments of the present disclosure provide the pixel compensation circuit, the driving method for the pixel compensation circuit, the display panel and the display device. The pixel compensation circuit includes a reset circuit, a data writer, a compensation circuit, a driver, and a light emitting device. A first control terminal of the reset circuit is connected to a first control signal terminal, a second control terminal of the reset circuit is connected to a second control signal terminal, a first input terminal and a second input terminal of the reset circuit are connected to a sensing line, a first output terminal of the reset circuit is connected to a first node, a second output terminal of the reset circuit is connected to a second node, and the reset circuit is configured to provide a reset signal output by the sensing line to the first node and the second node under control of the first control signal terminal and the second control signal terminal. A control terminal of the data writer is connected to a third control signal terminal, an input terminal of the data writer is connected to a data line, an output terminal of the data writer is connected to a third node, and the data writer is configured to provide a data signal output by the data line to the third node under control of the third control signal terminal. A first terminal of the compensation circuit is connected to the first node, a second terminal of the compensation circuit is connected to the second node, a third terminal of the compensation circuit is connected to the third node, and the compensation circuit is configured to provide a threshold voltage of the light emitting device to the third node. A control terminal of the driver is connected to the third node, an input terminal of the driver is connected to a first power supply terminal, an output terminal of the driver is connected to the second node, a terminal of the light emitting device is connected to the second node, another terminal of the light emitting device is grounded, and the driver is configured to drive the light emitting device to emit light under control of the third node. The threshold voltage of the light emitting device may be provided to the driver through the compensation circuit, and if the aging of the light emitting device occurs, the threshold voltage of the light emitting device is increased, so that the driver can provide a larger current to the light emitting device when the light emitting device is driven to emit light, thereby enhancing the brightness of the light emitting device in the aging area, and improving non-uniformity of light emission of a display panel.

It should be noted that in this disclosure, relational terms such as "first" and "second" are only used to distinguish one entity or operation from another entity or operation, and do not necessarily require or imply that there is any such relationship or sequence between these entities or operations.

It will be apparent to those skilled in the art that various modifications and variations can be made to the present disclosure without departing from the spirit and scope of the present disclosure. These modifications and variations of the present disclosure fall within the scope as defined by the claims and equivalents thereof, the present disclosure is also intended to include these modifications and variations.

What is claimed is:

1. A pixel compensation circuit, comprising a reset circuit, a data writer, a compensation circuit, and a driver; wherein:

a first control terminal of the reset circuit is connected to a first control signal terminal, a second control terminal of the reset circuit is connected to a second control signal terminal, a first input terminal and a second input terminal of the reset circuit are connected to a sensing line, a first output terminal of the reset circuit is connected to a first node, a second output terminal of the reset circuit is connected to a second node, and the reset circuit is configured to provide a reset signal output by the sensing line to the first node and the second node under control of the first control signal terminal and the second control signal terminal;

a control terminal of the data writer is connected to a third control signal terminal, an input terminal of the data writer is connected to a data line, an output terminal of the data writer is connected to a third node, and the data writer is configured to provide a data signal output by the data line to the third node under control of the third control signal terminal;

a first terminal of the compensation circuit is connected to the first node, a second terminal of the compensation circuit is connected to the second node, a third terminal of the compensation circuit is connected to the third node, and the compensation circuit is configured to provide a threshold voltage of a light emitting device to the third node; and a control terminal of the driver is connected to the third node, an input terminal of the driver is connected to a first power supply terminal, an output terminal of the driver is connected to the second node, and the driver is configured to drive the light emitting device to emit light under control of the third node.

2. The pixel compensation circuit according to claim 1, wherein a terminal of the light emitting device is connected to the second node, and another terminal of the light emitting device is connected to a power supply terminal which outputs a voltage lower than the voltage of a voltage output from the first power supply terminal.

3. The pixel compensation circuit according to claim 1, wherein:
the reset circuit comprises a first switching transistor and a second switching transistor;
a gate of the first switching transistor is connected to the first control signal terminal, a drain of the first switching transistor is connected to the sensing line, and a source of the first switching transistor is connected to the first node; and
a gate of the second switching transistor is connected to the second control signal terminal, a drain of the second switching transistor is connected to the sensing line, and a source of the second switching transistor is connected to the second node.

4. The pixel compensation circuit according to claim 3, wherein:
the first switching transistor, the second switching transistor and the third switching transistor and the driving transistor are all N-type transistors.

5. The pixel compensation circuit according to claim 1, wherein:
the data writing circuit comprises a third switching transistor; and
a gate of the third switching transistor is connected to the third control signal terminal, a drain of the third switching transistor is connected to the data line, and a source of the third switching transistor is connected to the third node.

6. The pixel compensation circuit according to claim 1, wherein:
the compensation circuit comprises a first capacitor and a second capacitor;
a terminal of the first capacitor is connected to the first node, and another terminal of the first capacitor is connected to the third node; and
a terminal of the second capacitor is connected to the first node, and another terminal of the second capacitor is connected to the second node.

7. The pixel compensation circuit according to claim 1, wherein:
the driver comprises a driving transistor; and
a gate of the driving transistor is connected to the third node, the drain of the driving transistor is connected to the first power supply terminal, and the source of the driving transistor is connected to the second node.

8. A display panel, comprising a pixel compensation circuit;
wherein the pixel compensation circuit comprises a reset circuit, a data writer, a compensation circuit, and a driver;
wherein:
a first control terminal of the reset circuit is connected to a first control signal terminal, a second control terminal of the reset circuit is connected to a second control signal terminal, a first input terminal and a second input terminal of the reset circuit are connected to a sensing line, a first output terminal of the reset circuit is connected to a first node, a second output terminal of the reset circuit is connected to a second node, and the reset circuit is configured to provide a reset signal output by the sensing line to the first node and the second node under control of the first control signal terminal and the second control signal terminal;
a control terminal of the data writer is connected to a third control signal terminal, an input terminal of the data writer is connected to a data line, an output terminal of the data writer is connected to a third node, and the data writer is configured to provide a data signal output by the data line to the third node under control of the third control signal terminal;
a first terminal of the compensation circuit is connected to the first node, a second terminal of the compensation circuit is connected to the second node, a third terminal of the compensation circuit is connected to the third node, and the compensation circuit is configured to provide a threshold voltage of a light emitting device to the third node; and
a control terminal of the driver is connected to the third node, an input terminal of the driver is connected to a first power supply terminal, an output terminal of the driver is connected to the second node, and the driver is configured to drive the light emitting device to emit light under control of the third node.

9. The display panel according to claim 8, wherein a terminal of the light emitting device is connected to the second node, and another terminal of the light emitting device is connected to a power supply terminal which outputs a voltage lower than the voltage of a voltage output from the first power supply terminal.

10. The display panel according to claim 8, wherein:
the reset circuit comprises a first switching transistor and a second switching transistor;
a gate of the first switching transistor is connected to the first control signal terminal, a drain of the first switching transistor is connected to the sensing line, and a source of the first switching transistor is connected to the first node; and
a gate of the second switching transistor is connected to the second control signal terminal, a drain of the second switching transistor is connected to the sensing line, and a source of the second switching transistor is connected to the second node.

11. The display panel according to claim 10, wherein:
the first switching transistor, the second switching transistor and the third switching transistor and the driving transistor are all N-type transistors.

12. The display panel according to claim 8, wherein:
the data writing circuit comprises a third switching transistor; and
a gate of the third switching transistor is connected to the third control signal terminal, a drain of the third switching transistor is connected to the data line, and a source of the third switching transistor is connected to the third node.

13. The display panel according to claim 8, wherein:
the compensation circuit comprises a first capacitor and a second capacitor;
a terminal of the first capacitor is connected to the first node, and another terminal of the first capacitor is connected to the third node; and a terminal of the second capacitor is connected to the first node, and another terminal of the second capacitor is connected to the second node.

14. The display panel according to claim 8, wherein:
the driver comprises a driving transistor; and
a gate of the driving transistor is connected to the third node, the drain of the driving transistor is connected to the first power supply terminal, and the source of the driving transistor is connected to the second node.

15. A display device, comprising a display panel according to claim 8.

16. A driving method for a pixel compensation circuit, wherein the pixel compensation circuit comprises a reset circuit, a data writer, a compensation circuit, and a driver; wherein:
a first control terminal of the reset circuit is connected to a first control signal terminal, a second control terminal of the reset circuit is connected to a second control signal terminal, a first input terminal and a second input terminal of the reset circuit are connected to a sensing line, a first output terminal of the reset circuit is connected to a first node, a second output terminal of the reset circuit is connected to a second node, and the reset circuit is configured to provide a reset signal output by the sensing line to the first node and the second node under control of the first control signal terminal and the second control signal terminal;
a control terminal of the data writer is connected to a third control signal terminal, an input terminal of the data writer is connected to a data line, an output terminal of the data writer is connected to a third node, and the data writer is configured to provide a data signal output by the data line to the third node under control of the third control signal terminal;
a first terminal of the compensation circuit is connected to the first node, a second terminal of the compensation circuit is connected to the second node, a third terminal of the compensation circuit is connected to the third node, and the compensation circuit is configured to provide a threshold voltage of a light emitting device to the third node; and
a control terminal of the driver is connected to the third node, an input terminal of the driver is connected to a first power supply terminal, an output terminal of the driver is connected to the second node, and the driver is configured to drive the light emitting device to emit light under control of the third node;
wherein the method comprises:
in a first data writing stage, resetting by the reset circuit a potential at the second terminal of the compensation circuit under control of the second control terminal, and writing by the data writer a first data signal output by the data line to the compensation circuit under control of the third control signal terminal;
in a compensation stage, providing by the compensation circuit the first data signal and the threshold voltage of the light emitting device to the control terminal of the driver;
in a reset stage, resetting by the reset circuit a potential at the first terminal of the compensation circuit under control of the first control signal terminal, and resetting by the reset circuit a potential at the output terminal of the driver under control of the second control signal terminal; and
in a light emitting stage, driving by the driver the light emitting device to emit light under joint control of the threshold voltage of the light emitting device and the first data signal.

17. The method according to claim 16, wherein before the reset stage in which the reset circuit resets the potential at the first terminal of the compensation circuit under control of the first control signal terminal, and resets the potential at the output terminal of the driver under control of the second control signal terminal, and after the light emitting stage in which the drivers drives the light emitting device to emit light under joint control of the threshold voltage of the light emitting device and the first data signal, the method further comprises:
in a second data writing stage, providing by the data writer a second data signal output by the data line to the control terminal of the driver under control of the third control signal terminal, wherein a voltage of the second data signal is equal to a sum of a voltage of the first data signal and the threshold voltage of a driving transistor in the driver.

* * * * *